US012616016B2

(12) United States Patent
Tsuchiya et al.

(10) Patent No.: US 12,616,016 B2
(45) Date of Patent: Apr. 28, 2026

(54) SEMICONDUCTOR DEVICE HAVING CONTACT PLUG

(71) Applicant: MICRON TECHNOLOGY, INC., Boise, ID (US)

(72) Inventors: Keiichi Tsuchiya, Higashihiroshima (JP); Keizo Kawakita, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 611 days.

(21) Appl. No.: 18/054,637

(22) Filed: Nov. 11, 2022

(65) Prior Publication Data

US 2024/0162154 A1 May 16, 2024

(51) Int. Cl.
| | |
|---|---|
| *H01L 23/535* | (2006.01) |
| *H01L 21/768* | (2006.01) |
| *H01L 23/528* | (2006.01) |
| *H01L 23/532* | (2006.01) |

(52) U.S. Cl.
CPC ...... *H01L 23/535* (2013.01); *H01L 21/76805* (2013.01); *H01L 21/7684* (2013.01); *H01L 21/76846* (2013.01); *H01L 21/76865* (2013.01); *H01L 21/76895* (2013.01); *H01L 23/5283* (2013.01); *H01L 23/53238* (2013.01); *H01L 23/53266* (2013.01)

(58) Field of Classification Search
None
See application file for complete search history.

(56) References Cited

U.S. PATENT DOCUMENTS

| | | | |
|---|---|---|---|
| 2014/0027822 A1* | 1/2014 | Su | H01L 23/53238 |
| | | | 438/653 |
| 2015/0262896 A1* | 9/2015 | Yamanaka | H01L 24/03 |
| | | | 438/666 |
| 2020/0043785 A1 | 2/2020 | Chen et al. | |
| 2024/0222268 A1 | 7/2024 | Tashiro et al. | |

OTHER PUBLICATIONS

U.S. Appl. No. 18/483,748 titled "Semiconductor Device Having Contact Plug" filed Oct. 10, 2023.
U.S. Appl. No. 18/051,670, titled "Semiconductor Device Having Contact Plug" filed Nov. 1, 2022.

* cited by examiner

*Primary Examiner* — Alexander G Ghyka
(74) *Attorney, Agent, or Firm* — Dorsey & Whitney LLP

(57) ABSTRACT

An apparatus that includes a first conductive pattern positioned at a first wiring layer and extending in a first direction, a second conductive pattern positioned at a second wiring layer located above the first wiring layer and extending in a second direction crossing the first direction, and a contact plug connecting the first conductive pattern with the second conductive pattern. The contact plug includes a lower conductive section contacting the first conductive pattern and an upper conductive section contacting the second conductive pattern. A maximum width of the upper conductive section in the first direction is smaller than a maximum width of the lower conductive section in the first direction.

17 Claims, 7 Drawing Sheets

SEMICONDUCTOR DEVICE HAVING CONTACT PLUG

BACKGROUND

A general semiconductor device includes a plurality of wiring layers. Wiring patterns respectively formed in two wiring layers vertically adjacent to each other may cross and be connected to each other via a contact plug provided at a crossing. When the diameter of the contact plug is small, the contact resistance becomes high. When the diameter of the contact plug is large, the dielectric strength between a wiring pattern adjacent to the wiring pattern connected to the contact plug and the contact plug is reduced.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1A:
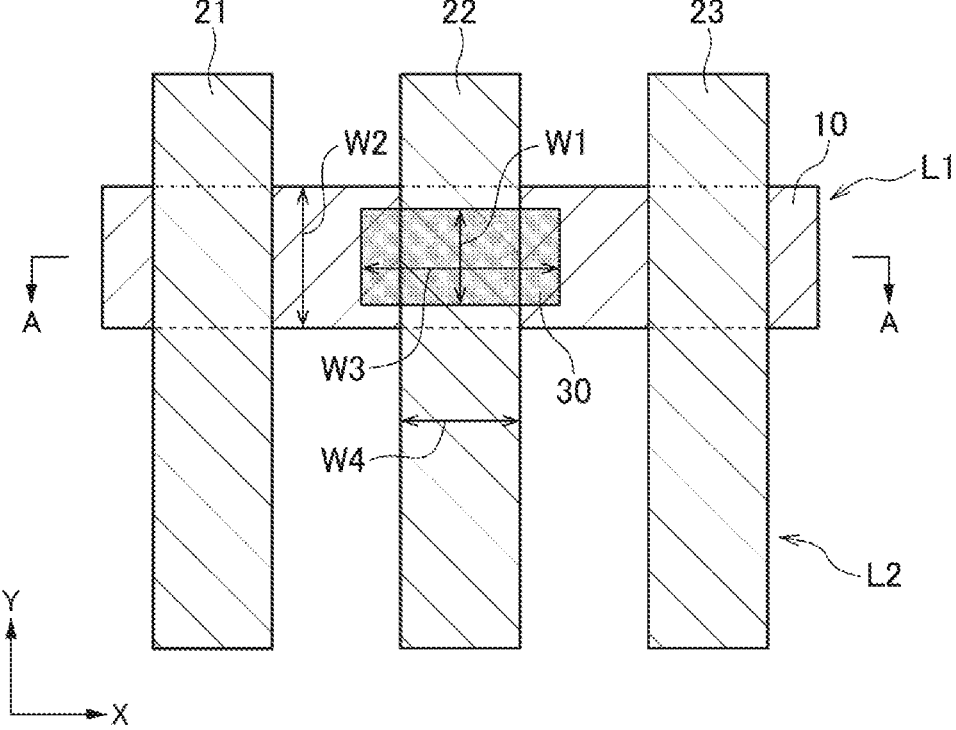
FIG. 1A is a schematic plan view showing a configuration of a main portion of a semiconductor device according to an embodiment of the present disclosure.
Figure 1B:
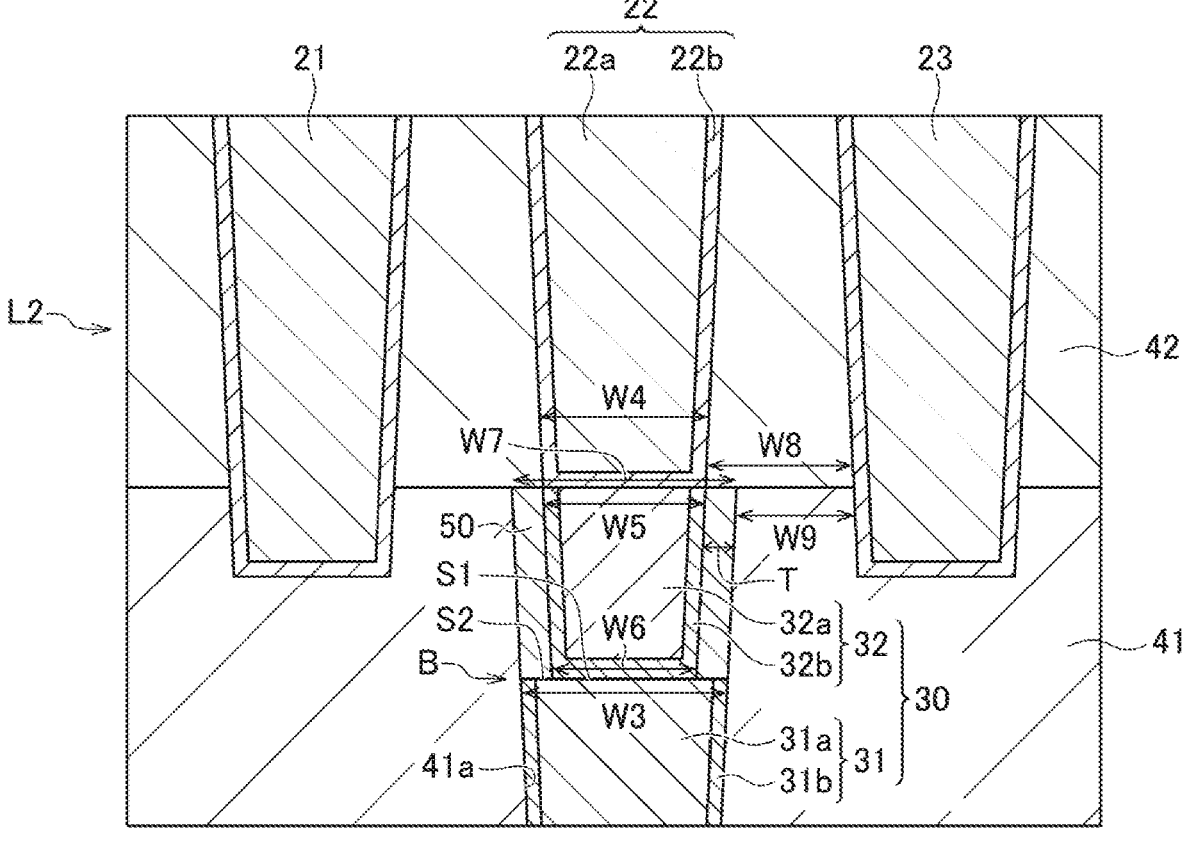
FIG. 1B is a schematic cross-sectional view taken along a line A-A in FIG. 1A.

FIG. 1A is a schematic plan view showing a configuration of a main portion of a semiconductor device according to an embodiment of the present disclosure. FIG. 1B is a schematic cross-sectional view taken along a line A-A in FIG. 1A. As shown in FIG. 1A, the semiconductor device according to the present embodiment includes a wiring pattern 10 positioned at a conductor layer L1 and wiring patterns 21 to 23 positioned at a conductor layer L2. The conductor layer L1 is located below the conductor layer L2 and tungsten (W), for example, may be used as its material. The conductor layer L2 may be made of, for example, copper (Cu). The wiring pattern 10 positioned at the conductor layer L1 extends in the X direction, and the wiring patterns 21 to 23 positioned at the conductor layer L2 extend in the Y direction. In some examples, the X direction and the Y direction may be perpendicular to each other. The wiring pattern 10 and the wiring patterns 21 to 23 cross each other in plan view. A contact plug 30 is provided at a crossing between the wiring pattern 10 and the wiring pattern 22. The wiring pattern 10 and the wiring pattern 22 are thus short-circuited via the contact plug 30. A width W1 of the contact plug 30 in the Y direction at its bottom surface in contact with the wiring pattern 10 may be smaller than a width W2 of the wiring pattern 10 in the Y direction. Meanwhile, a maximum width W3 of the contact plug 30 in the X direction may be greater than a width W4 of the wiring pattern 22 in the X direction. By setting the width W3 to be larger than the width W4 in this manner, the resistance value of the contact plug 30 is reduced.

As shown in FIG. 1B, the wiring pattern 22 includes a main body part 22a made of a metal, for example, copper (Cu) and a barrier metal part 22b formed on the surface of the main body part 22a. This is the same for the other wiring patterns 21 and 23. The contact plug 30 includes a lower conductive section 31 in contact with the wiring pattern 10 and an upper conductive section 32 in contact with the wiring pattern 22. The lower conductive section 31 of the contact plug 30 includes a main body part 31a made of a metal, for example, tungsten (W) and a bather metal part 31b provided on the surface of the main body part 31a. Similarly, the upper conductive section 32 of the contact plug 30 includes a main body part 32a made of a metal, for example, tungsten (W) and a barrier metal part 32b provided on the surface of the main body part 32a. The contact plug 30 is embedded in an interlayer insulating film 41 covering the conductor layer L1. When the interlayer insulating film 41 is thick, the aspect ratio of the contact plug 30 may be extremely large. The wiring patterns 21 to 23 are embedded in an interlayer insulating film 42 provided on the interlayer insulating film 41. In the cross-section shown in FIG. 1B, a part of the wiring patterns 21 and 23 is embedded in the interlayer insulating film 41. The depth position of the bottom of the wiring patterns 21 and 23 overlaps the upper conductive section 32 of the contact plug 30.

The contact plug 30 is embedded in a via hole 41a formed in the interlayer insulating film 41. The diameter of the via hole 41a becomes smaller as its depth position becomes deeper. Therefore, the size of the via hole 41a in the X direction is a maximum width W7 at an opening that is in contact with the interlayer insulating film 42. The size W7 of the via hole 41a in the X direction at the opening is greater than the size W4 of the wiring pattern 22 in the X direction at the bottom. Accordingly, a distance W9 in the X direction between the via hole 41a and the bottom of the wiring pattern 21 or 23 is shorter than a distance W8 in the X direction between the bottom of the wiring pattern 22 and the wiring pattern 21 or 23.

The lower conductive section 31 of the contact plug 30 is in direct contact with the interlayer insulating film 41. Meanwhile, a sidewall insulating film 50 is interposed between the upper conductive section 32 of the contact plug 30 and the interlayer insulating film 41. The upper conductive section 32 of the contact plug 30 is surrounded by the sidewall insulating film 50. Accordingly, the size of the upper conductive section 32 of the contact plug 30 in the X direction is reduced by a size corresponding to twice a thickness T of the sidewall insulating film 50. Therefore, the distance in the X direction between the contact plug 30 and the wiring pattern 21 or 23 is W9 in a case where the via hole 41a is entirely filled with the contact plug 30, whereas the distance in the X direction between the contact plug 30 and the wiring pattern 21 or 23 is W8 ($\approx$W9+T) in the present embodiment.

The size of the upper conductive section 32 of the contact plug 30 in the X direction is a maximum width W5 in its upper surface in contact with the wiring pattern 22. The diameter of the contact plug 30 changes at a boundary surface B between the lower conductive section 31 and the upper conductive section 32. The size of the lower conductive section 31 of the contact plug 30 in the X direction is the maximum width W3 at the boundary surface B. The size of the upper conductive section 32 of the contact plug 30 in the X direction at the boundary surface B is a width W6 and is smaller than the width W3. The maximum width W5 of the upper conductive section 32 of the contact plug 30 in the X direction is smaller than the maximum width W3 of the lower conductive section 31 of the contact plug 30 in the X direction. The upper surface of the lower conductive section 31 positioned at the boundary surface B includes a region S1 in contact with the bather metal part 32b of the upper conductive section 32 and a region S2 that surrounds the region S1 and is in contact with the lower surface of the sidewall insulating film 50. The lower surface of the sidewall insulating film 50 is in contact with the upper end surface of the bather metal part 31b which is exposed in the region S1. The upper surface of the sidewall insulating film 50 is in contact with the interlayer insulating film 42.

With this configuration, the distance in the X direction between the upper conductive section 32 of the contact plug 30 and the bottom of the wiring pattern 21 or 23 is increased by the thickness T of the sidewall insulating film 50. Therefore, even in a case where the distance in the X direction between the via hole 41a and the bottom of the wiring pattern 21 or 23 is shorter, the distance in the X direction between the upper conductive section 32 of the contact plug 30 and the bottom of the wiring pattern 21 or 23 is sufficiently ensured, so that a dielectric strength between them is ensured.

Next, a manufacturing method of the semiconductor device according to the present embodiment is described.

Figure 2A:
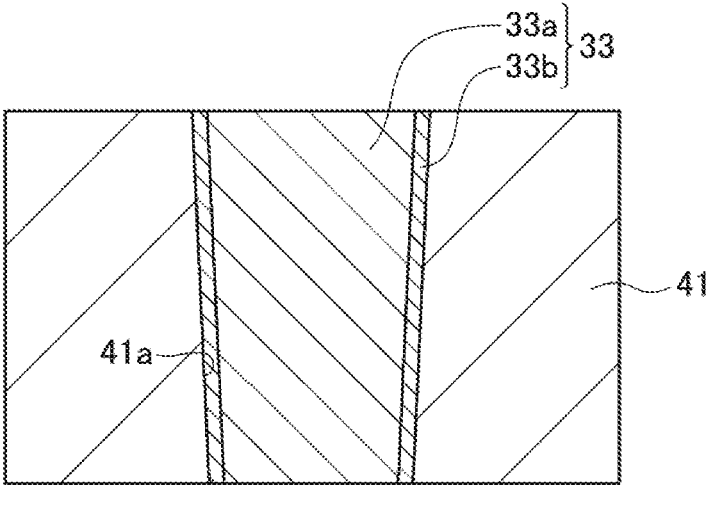
FIGS. 2A to 2H are process diagrams for explaining a manufacturing method of the semiconductor device according to the embodiment of the present disclosure.
Figure 2B:
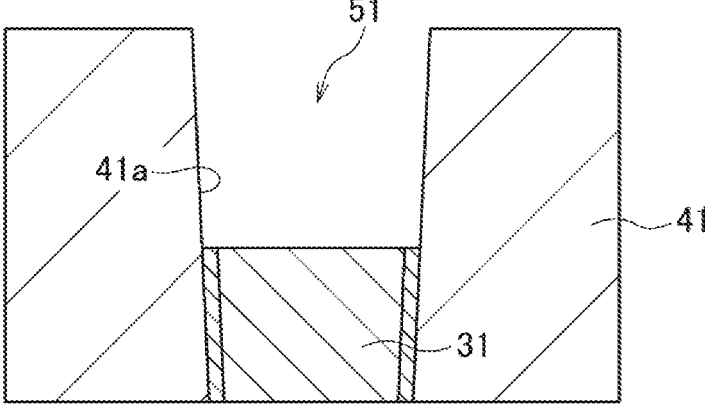
Figure 2C:
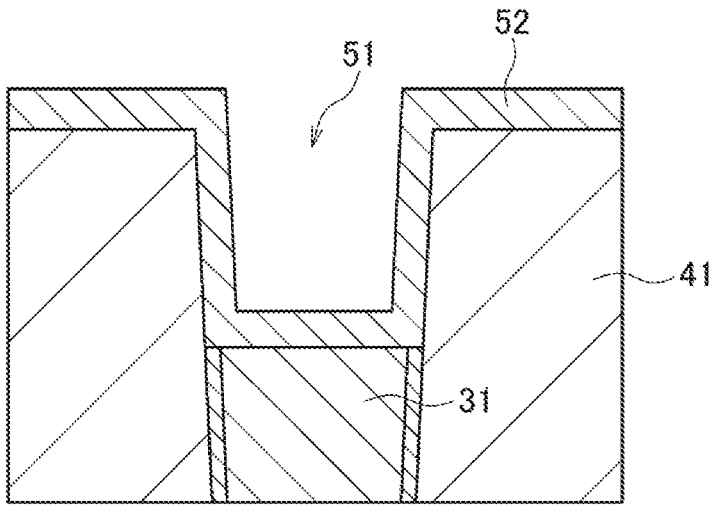

First, as shown in FIG. 2A, the via hole 41a is formed in the interlayer insulating film 41, and thereafter a contact plug 33 including a barrier metal part 33b and a main body part 33a is formed in the via hole 41a. The contact plug 33 penetrates through the interlayer insulating film 41 and is in contact with the wiring pattern 10. Next, as shown in FIG. 2B, the contact plug 33 is etched back. An upper conductive section of the contact plug 33 is thus removed, and a recess 51 is formed in the removed portion. The recess 51 is a part of the via hole 41a and is surrounded by the interlayer insulating film 41. The remaining portion of the contact plug 33 forms the lower conductive section 31. Next, as shown in FIG. 2C, an insulating film 52 made of silicon oxide or the like is formed on the entire surface by CVD. The insulating film 52 is formed not only on the upper surface of the interlayer insulating film 41 but also in the recess 51.

Figure 2D:
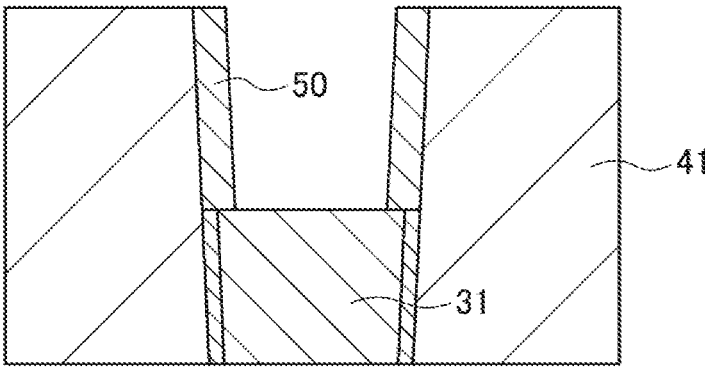
Figure 2E:
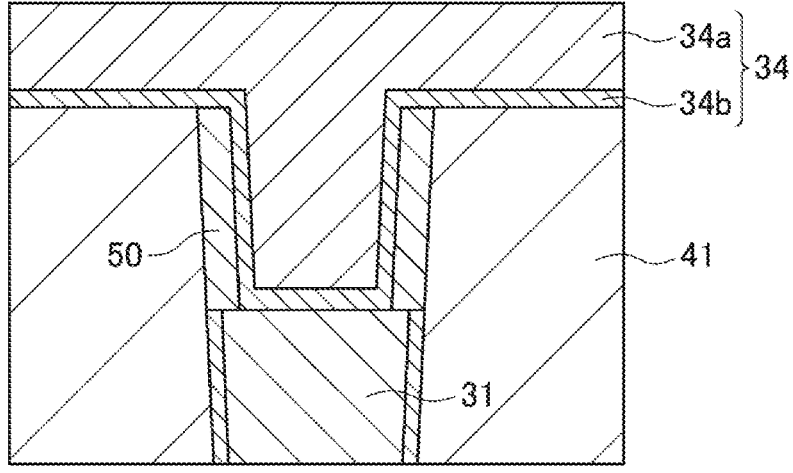
Figure 2F:
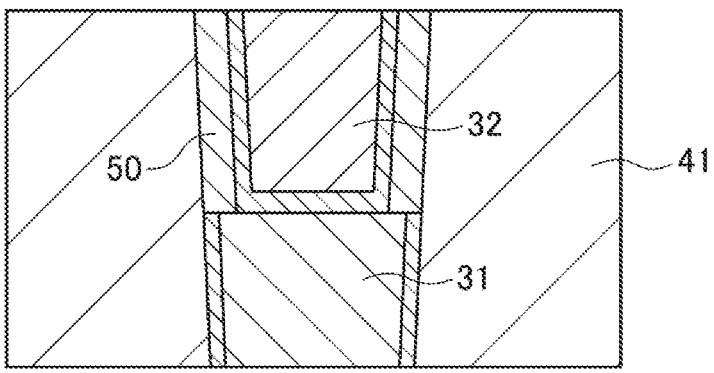
Figure 2G:
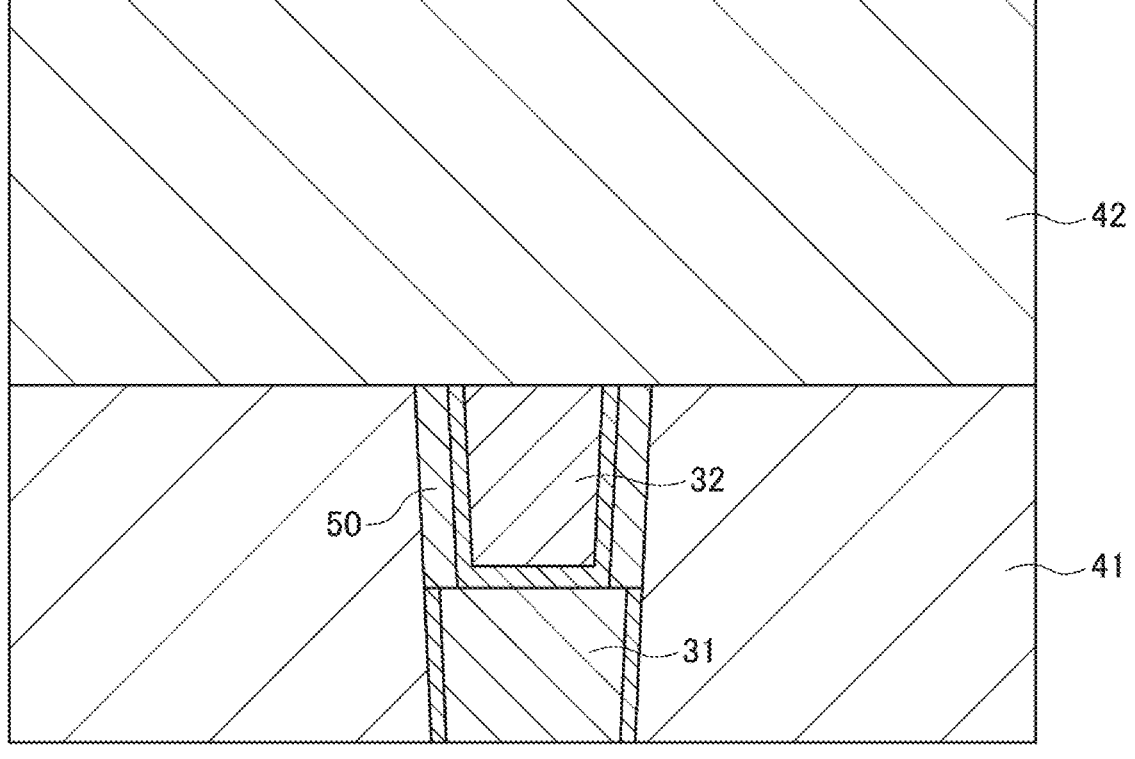

Next, as shown in FIG. 2D, the insulating film 52 is etched back, whereby the insulating film 52 formed on the upper surface of the interlayer insulating film 41 and at the bottom of the recess 51 is removed. Consequently, the insulating film 52 remaining on the inner wall of the recess 51 becomes the sidewall insulating film 50. Next, as shown in FIG. 2E, a conductor film 34 including a barrier metal part 34b and a main body part 34a is formed on the entire surface. The conductor film 34 is embedded in the recess 51 completely, and is in contact with the lower conductive section 31 of the contact plug 30. Next, as shown in FIG. 2F, CMP is performed until the upper surface of the interlayer insulating film 41 is exposed. Consequently, the remaining conductor film 34 becomes the upper conductive section 32 of the contact plug 30. The upper conductive section 32 of the contact plug 30 forms substantially the same plane as the upper surface of the interlayer insulating film 41.

Figure 2H:
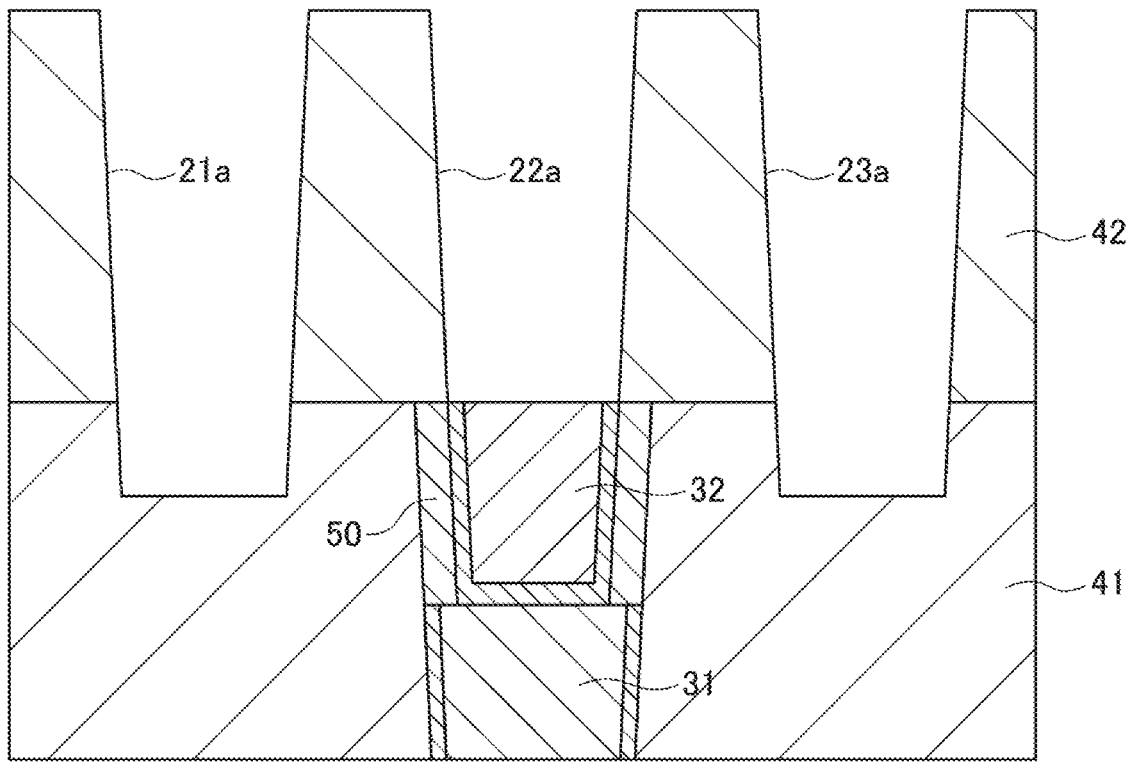

Next, as shown in FIG. 2Q the interlayer insulating film 42 is formed on the interlayer insulating film 41. Subsequently, as shown in FIG. 2H, a plurality of grooves 21a to 23a for embedding the wiring patterns 21 to 23 are formed in the interlayer insulating film 42. The upper surface of the upper conductive section 32 of the contact plug 30 is exposed at the bottom of the groove 22a corresponding to the wiring pattern 22. In the cross-section shown in FIG. 2H, the bottom of the grooves 21a and 23a reaches the interlayer insulating film 41. The wiring patterns 21 to 23 are then embedded in the grooves 21a to 23a by a damascene process, respectively, to obtain the configuration shown in FIG. 1B.

As described above, in the present embodiment, the recess 51 is formed by etching back the contact plug 33, the sidewall insulating film 50 is formed in the recess 51, and thereafter the upper conductive section 32 of the contact plug 30 is formed. Therefore, the distance in the X direction between the upper conductive section 32 of the contact plug 30 and the wiring pattern 21 or 23 can be sufficiently ensured. Further, since any mask for forming the sidewall insulating film 50 is unnecessary, increase in the manufacturing cost is slight.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a first conductive pattern positioned at a first wiring layer and extending in a first direction;
a second conductive pattern positioned at a second wiring layer located above the first wiring layer and extending in a second direction crossing the first direction;
a first interlayer insulating film between the first and second wiring layers; and
a contact plug embedded in the first interlayer insulating film and connecting the first conductive pattern with the second conductive pattern,
wherein the contact plug includes a lower conductive section contacting the first conductive pattern and an upper conductive section contacting the second conductive pattern, and
wherein a maximum width of the upper conductive section in the first direction is smaller than a maximum width of the lower conductive section in the first direction.

2. The apparatus of claim 1,
wherein the contact plug has a boundary surface between the lower conductive section and the upper conductive section, and
wherein a width of the upper conductive section on the boundary surface in the first direction is smaller than a width of the lower conductive section on the boundary surface in the first direction.

3. The apparatus of claim 2, further comprising:

a sidewall insulating film located between the first interlayer insulating film and the upper conductive section of the contact plug.

4. The apparatus of claim 3, wherein the first interlayer insulating film has a via hole filled with the contact plug and the sidewall insulating film, and wherein a maximum width of the via hole is greater than a width of the second conductive pattern in the first direction.

5. An apparatus comprising:

a first conductive pattern positioned at a first wiring layer and extending in a first direction;

a second conductive pattern positioned at a second wiring layer located above the first wiring layer and extending in a second direction crossing the first direction;

a contact plug connecting the first conductive pattern with the second conductive pattern;

a first interlayer insulating film located between the first and second wiring layers, wherein the contact plug penetrates the first interlayer insulating film; and a sidewall insulating film located between the first interlayer insulating film and the upper conductive section of the contact plug, wherein the contact plug includes a lower conductive section contacting the first conductive pattern and an upper conductive section contacting the second conductive pattern, and wherein a maximum width of the upper conductive section in the first direction is smaller than a maximum width of the lower conductive section in the first direction, wherein the first interlayer insulating film has a via hole filled with the contact plug and the sidewall insulating film, wherein a maximum width of the via hole is greater than a width of the second conductive pattern in the first direction, and wherein the lower conductive section of the contact plug is covered with the first interlayer insulating film without the sidewall insulating film interposed therebetween.

6. The apparatus of claim 5, wherein the sidewall insulating film has a lower surface contacting the boundary surface of the lower conductive section of the contact plug.

7. The apparatus of claim 6, further comprising a second interlayer insulating film located on the first interlayer insulating film so as to embed the second conductive pattern, wherein the sidewall insulating film further has an upper surface contacting the second interlayer insulating film.

8. The apparatus of claim 7, wherein the lower conductive section of the contact plug includes a first main metal part and a first barrier metal part located between the first main metal part and the first interlayer insulating film, and wherein the lower surface of the sidewall insulating film contacts an upper end of the first barrier metal part.

9. The apparatus of claim 8, wherein the upper conductive section of the contact plug includes a second main metal part and a second barrier metal part located between the second main metal part and the sidewall insulating film, and wherein the second barrier metal part contacts the boundary surface.

10. The apparatus of claim 9, wherein the first main metal part comprises the same material as the second main metal part.

11. The apparatus of claim 10, wherein the second conductive pattern includes a third main metal part and a third barrier metal part located between the third main metal part and the second interlayer insulating film, and wherein the third main metal part comprises a different material from the first and second main metal parts.

12. The apparatus of claim 11, wherein each of the first and second main metal parts comprises tungsten (W), and wherein the third main metal part comprises cupper (Cu).

13. The apparatus of claim 7, further comprising a third conductive pattern positioned at the second wiring layer and extending in the second direction along the second conductive pattern, wherein a part of the third conductive pattern is embedded in the first interlayer insulating film.

14. The apparatus of claim 1, wherein a width of the lower conductive section on a bottom surface contacting the first conductive pattern in the second direction is smaller than a width of the first conductive pattern in the second direction.

15. An apparatus comprising:

a first conductive pattern positioned at a first wiring layer and extending in a first direction;

a second conductive pattern positioned at a second wiring layer located above the first wiring layer and extending in a second direction crossing the first direction;

an interlayer insulating film located between the first and second wiring layers;

a contact plug penetrating the interlayer insulating film so as to connect the first conductive pattern with the second conductive pattern, the contact plug including a lower conductive section having a lower surface contacting the first conductive pattern and an upper conductive section having an upper surface contacting the second conductive pattern; and a sidewall insulating film located between the interlayer insulating film and the upper conductive section of the contact plug, wherein the lower conductive section of the contact plug is covered with the interlayer insulating film without the sidewall insulating film interposed therebetween.

16. The apparatus of claim 15, wherein the lower conductive section of the contact plug further has an upper surface having a first region contacting the upper conductive section of the contact plug and a second region surrounding the first region and contacting with the sidewall insulating film.

17. The apparatus of claim 16, wherein a width of the upper surface of the upper conductive section of the contact plug in the first direction is smaller than a width of the upper surface of the lower conductive section of the contact plug in the first direction.

* * * * *